United States Patent
Cyrusian

(10) Patent No.: US 8,138,822 B1
(45) Date of Patent: Mar. 20, 2012

(54) CIRCUITS AND METHODS FOR CALIBRATING SWITCHING CURRENT SOURCES

(75) Inventor: Sasan Cyrusian, Scotts Valley, CA (US)

(73) Assignee: Marvell International Ltd., Hamilton (BM)

( * ) Notice: Subject to any disclaimer, the term of this patent is extended or adjusted under 35 U.S.C. 154(b) by 261 days.

(21) Appl. No.: 12/652,223

(22) Filed: Jan. 5, 2010

Related U.S. Application Data

(60) Provisional application No. 61/142,766, filed on Jan. 6, 2009.

(51) Int. Cl.
*G05F 1/10* (2006.01)
(52) U.S. Cl. .......... 327/538; 327/157
(58) Field of Classification Search .......... 327/147, 327/148, 150, 156, 157, 159, 534, 535, 536, 327/538
See application file for complete search history.

(56) References Cited

U.S. PATENT DOCUMENTS

| | | | | |
|---|---|---|---|---|
| 6,850,102 | B2* | 2/2005 | Hsu et al. | 327/157 |
| 7,184,510 | B2* | 2/2007 | Jung | 375/374 |
| 7,202,718 | B2* | 4/2007 | Lindner et al. | 327/157 |
| 7,439,784 | B2* | 10/2008 | Lin | 327/157 |
| 7,701,271 | B1* | 4/2010 | Sanielevici et al. | 327/157 |
| 7,906,998 | B2* | 3/2011 | Yamazaki | 327/157 |

* cited by examiner

*Primary Examiner* — Jeffrey Zweizig

(57) ABSTRACT

In one embodiment the present invention includes circuits and methods for calibrating switching current sources. A difference between a source current and a sink current is detected during a calibration phase. The difference is used to generate a digital signal to adjust a programmable current source to reduce the difference between currents. In one embodiment, a binary search is used to generate the digital signal during an initial calibration phase, and a linear approximation is used to generate the digital signal during an operational calibration phase.

20 Claims, 10 Drawing Sheets

CIRCUITS AND METHODS FOR CALIBRATING SWITCHING CURRENT SOURCES

CROSS REFERENCE TO RELATED APPLICATIONS

This application claims the benefit of U.S. Provisional Application No. 61/142,766, filed Jan. 6, 2009, the disclosure of which is incorporated herein by reference.

BACKGROUND

The present invention relates to current sources, and in particular, to circuits and methods for calibrating switching current sources.

FIG. 1 illustrates a conventional switching current source 100. Switching current source 100 includes a current source 101, switch 102 ("SW1"), switch 103 ("SW2"), and current source 104. SW1 is responsive to signal S1, and SW2 is responsive to signal S2. Signals S1 and S2 are used to open and close SW1 and SW2. Current source 101 is coupled between a power supply terminal, Vdd, and SW1. Therefore, when SW1 is closed, current ("Ipos") from current source 101 flows into an output node 110. Similarly, when SW2 is closed, current ("Ineg") from current source 104 flows out of the output node 110. Signals S1 and S2 are typically generated to control the voltage on output node 110 resulting from currents Ipos and Ineg.

Switching current source 100 may include errors resulting from mismatch in current source 101 and current source 104. Such mismatch may cause corresponding errors in the voltage at the output node 110.

SUMMARY

In one embodiment, the present invention includes a circuit comprising a first current source, a first switch, a second current source, a second switch. The first switch has a first terminal coupled to an output of the first current source and a second terminal coupled to an output node. The second switch has a first terminal coupled to an output of the second current source and a second terminal coupled to the output node. The circuit further includes a third switch and a fourth switch. The third switch is configured to open and close in response to a calibration signal. The third switch has a first terminal coupled to the output of the first current source and a second terminal coupled to a first node. The fourth switch is configured to open and close in response to the calibration signal. The fourth switch has a first terminal coupled to the output of the second current source and a second terminal coupled to the first node. The circuit further includes a programmable current source having an output coupled to the first current source or the second current source. The calibration signal closes the third switch and the fourth switch in response to both the first switch and the second switch being open. The programmable current source is adjusted using a digital signal to reduce a difference between a first current from the first current source into the first node and a second current into the second current source out of the first node, wherein the digital signal is generated using a digital algorithm based on said difference.

In one embodiment, the present invention includes a method comprising detecting a first signal, the first signal opening and closing a first switch, the first switch having a first terminal coupled to an output of a first current source and a second terminal coupled to an output node, detecting a second signal, the second signal opening and closing a second switch, second switch having a first terminal coupled to an output of a second current source and a second terminal coupled to the output node, closing a third switch and a fourth switch when both the first and second switches are open, the third switch having a first terminal coupled to the output of the first current source and a second terminal coupled to a first node and the fourth switch having a first terminal coupled to the output of the second current source and a second terminal coupled to the first node, detecting a difference between a first current from the first current source into the first node and a second current into the second current source out of the first node, and adjusting a programmable current source using a digital signal to reduce the difference, the programmable current source having an output coupled to the first current source or the second current source, wherein the digital signal is generated using a digital algorithm based on said difference.

Features and potential advantages of the present invention include a circuit for calibrating the switching current source so that a current Ipos substantially matches a current Ineg.

The following detailed description and accompanying drawings provide a detailed description of the present invention.

DETAILED DESCRIPTION

Described herein are techniques for calibrating switching current source circuits. In the following description, for purposes of explanation, numerous examples and specific details are set forth in order to provide a thorough understanding of the present invention. The present invention as defined by the claims may include some or all of the features in these examples alone or in combination with other features described below, and may further include modifications and equivalents of the features and concepts described herein.

Figure 1:
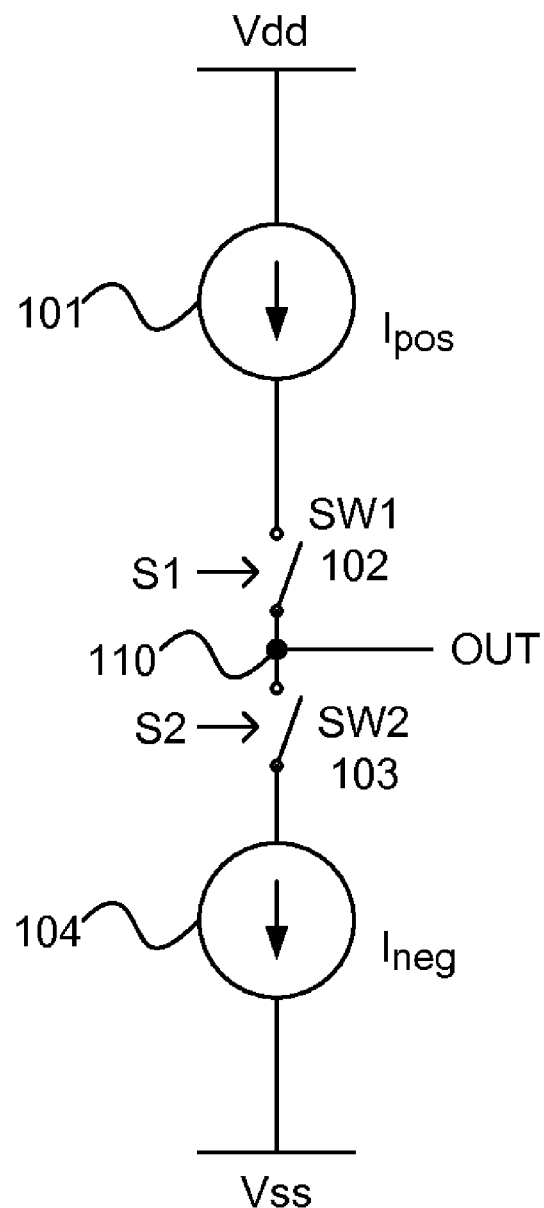
FIG. 1 illustrates a conventional switching current source.
Figure 2:
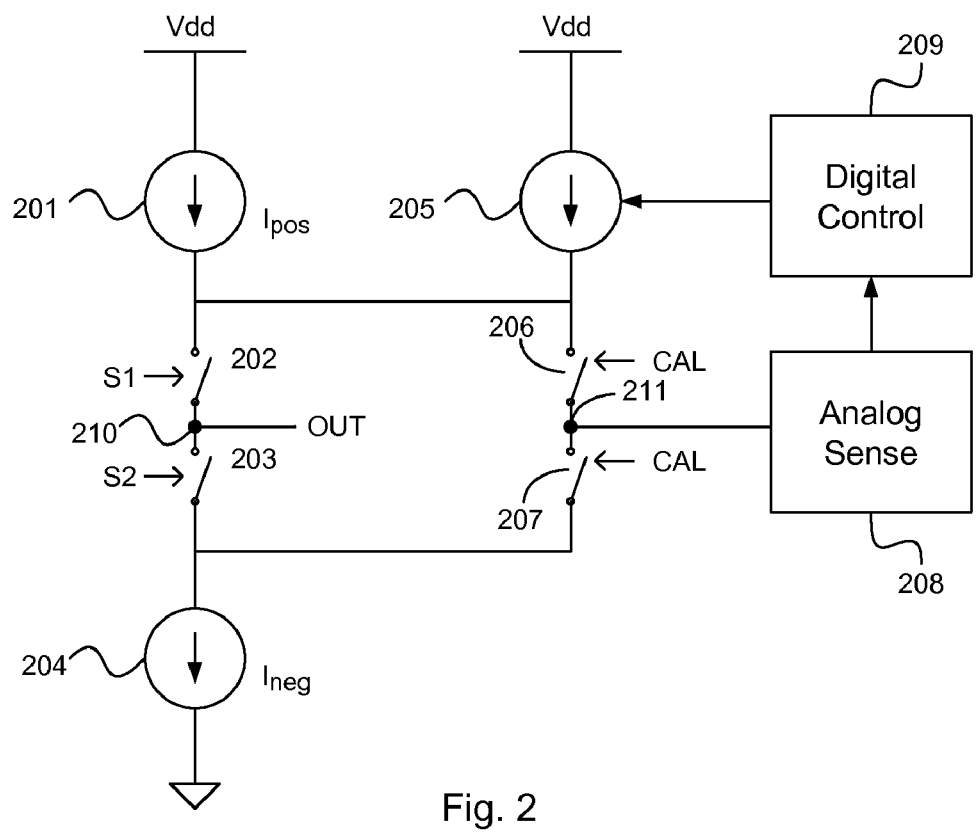
FIG. 2 illustrates an example switching current source circuit.

FIG. 2 illustrates an example implementation of a switching current source circuit 200. Circuit 200 includes a current source 201 coupled between a power supply terminal (e.g., Vdd) and a first terminal of a switch 202. A second terminal of switch 202 is coupled to an output node 210 ("Out") and to a first terminal of a switch 203. Current source 204 is coupled between a negative supply terminal (e.g., Vss or ground) and a second terminal of switch 203. Current source 201 sources a current Ipos. Current source 204 sinks a current Ineg.

Circuit 200 further includes a programmable current source 205, switch 206, and switch 207. Programmable current source 205 is coupled between power supply terminal Vdd and a node that is also coupled to the output of current source 201, the first terminal of switch 202, and a first terminal of switch 206. Accordingly, each of the first terminal of switch 206 and the first terminal of switch 202 are coupled to the output of current source 201 and the output of programmable current source 205. A second terminal of switch 206 is coupled to a node 211. A first terminal of switch 207 is also coupled to node 211, and a second terminal of switch 207 is coupled to current source 204. In other embodiments, programmable current source 205 could be configured with an output coupled to an output of current source 204. The output of current source 204 produces a negative current (e.g., current source 204 sinks current). Additionally, while circuit 200 illustrates the use of a single programmable current source, additional programmable current sources could be used (e.g., one programmable current source to adjust the positive current and another programmable current source to adjust the negative current). Switches 202, 203, 206, and 207 may be implemented using a variety of techniques. For example these switches may be implemented using MOS transistors.

During calibration, signal S1 opens switch 202 and signal S2 opens switch 203, and a calibration signal ("CAL") closes switch 206 and switch 207. Signals S1 and S2 may be derived from pulse width modulated signals in a pulse width modulated system, such as a switching (e.g., class D) amplifier, for example. In another embodiment, signals S1 and S2 may be generated from a feedback loop, such as a phase detector in a phase locked loop, for example. In different embodiments described in more detail below, there may be two types (or phases) of calibration: an initial calibration phase and an operational calibration phase. Different calibration techniques may be implemented using a digital signal to adjust the programmable current source 205. Specifically, the programmable current source 205 is adjusted using a digital signal to reduce a difference between current Ipos from current source 201 into node 211 and current Ineg into current source 204 out of node 211. The digital signal is generated using a digital algorithm based on the difference between currents Ipos and Ineg, and the algorithm may be different for different calibration phases, for example.

Circuit 200 includes an analog sense circuit 208 coupled to node 211 and a digital control circuit 209 coupled to programmable current source 205. Analog sense circuit 208 detects current into or out of node 211 (e.g., by sensing either voltage or current). A digital output of analog sense circuit 208 is coupled to an input of digital control circuit 209. Digital control circuit 209 may implement a digital algorithm to generate a digital signal to increase a current Idelta from programmable current source 205 if current Ipos is less than current Ineg. Similarly, the digital algorithm in digital control circuit 209 may adjust the digital signal to decrease current Idelta if current Ipos greater than current Ineg.

In this example, current source 201 may be configured to generate a smaller current than current source 204 (e.g., Ipos<Ineg). In one specific embodiment, current Ipos is configured to be less than current Ineg by approximately one-half (½) the maximum (fullscale) current output of programmable current source 205, and current Idelta may be adjusted using a digital signal from digital control circuit 209 to balance the currents into and out of node 211.

As described in more detail below, a digitally controlled calibration system may be used to digitally adjust programmable current source 205 during an initial calibration phase and during an operational calibration phase. For example, current Idelta may be set during an initial calibration phase, and current Idelta may be reset during operational calibration phases that occur while the circuit is operating to compensate for temperature variations, drift, and other variations. In some embodiments, the calibration procedure may be different at different calibration phases. For example, during an initial calibration phase, a binary search may be used to calibrate the currents (e.g., using a successive approximation circuit). During an operational calibration phase, a linear approximation may be used to adjust the currents. Different calibration circuits may be used for different calibration phases, for example. Additionally, during an operational calibration phase, there may not be sufficient time to open both switches 202 and 203 and close switches 206 and 207 to perform a calibration without distorting the voltages or currents at the output node 210. In one embodiment described in more detail below, during operation of the circuit 200, if a time period between deactivation of signal S1 for turning switch 202 off and activation of signal S2 for turning switch 203 on is greater than a threshold, then the circuit 200 may enter an operational calibration phase, and the programmable current source 205 can be digitally adjusted.

Figure 3:
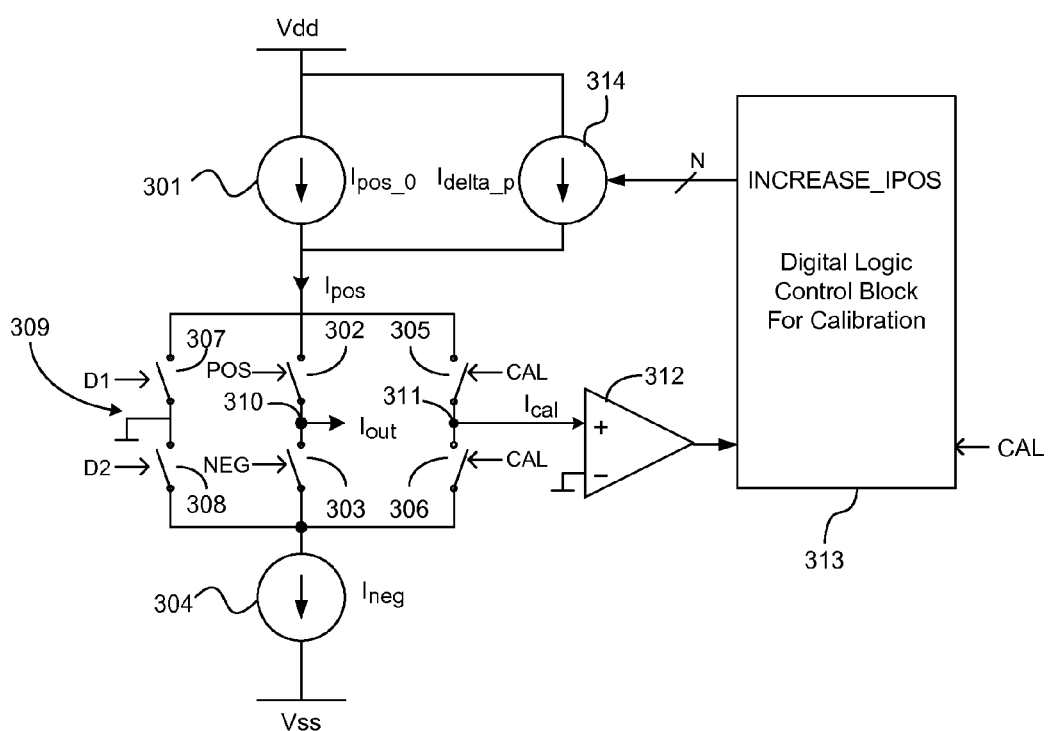
FIG. 3 illustrates an example switching current source with a single programmable current source.

FIG. 3 illustrates an example switching current source circuit 300 including a single programmable current source 314. Circuit 300 includes current source 301, switch 302, switch 303, and current source 304 configured in series between a high power supply terminal Vdd and a lower power supply terminal Vss. A programmable current source 314 is configured in parallel with current source 301, and calibration switches 305 and 306 are configured in parallel with switches 302 and 303. Circuit 300 further includes dummy load switches 307-308 operable to switch in a dummy load 309. For example, when switch 302 is closed and switch 303 is open, dummy load switch 308 may be closed to maintain a current path for current Ineg. Similarly, when switch 302 is open and switch 303 is closed, dummy load switch 307 may be closed to maintain a current path for current Ipos. If both switches 302 and 303 are open and a calibration is being performed, (in one implementation) dummy load switches 307, 308 are kept open. Dummy load switches 307, 308 are respectively controlled by signals D1, D2.

In this example, node 311, between calibration switches 305 and 306, is coupled to a comparison circuit 312. Comparison circuit 312 may include a comparator or amplifier and other components, for example. If current Ipos is greater than current Ineg, then when switches 305 and 306 are closed a current Ical will flow into the positive (+) input of comparison circuit 312. Alternatively, if current Ipos is less than current Ineg, then when switches 305 and 306 are closed a current Ical will flow out of the positive (+) input of comparison circuit 312. The negative (−) input of comparison circuit 312 is coupled to ground, which is one-half the voltage difference between Vdd and Vss in this example. The resulting output of comparison circuit 312 will either be high or low, respectively. The output may be a digital voltage level that is captured by digital logic and control block 313.

In one implementation, digital logic and control block 313 generates an N-bit digital signal ("INCREASE_IPOS") coupled to programmable current source 314 using N signal lines. Programmable current source 314 may include a current mode digital-to-analog converter ("DAC"), for example. If the output of comparison circuit 314 is high, then a comparison output signal from comparison circuit 312 may result in a digital signal to reduce current Idelta_p generated by programmable current source 314. Alternatively, if the output of comparison circuit 314 is low, then the comparison output may result in a digital signal to increase the current Idelta_p generated by programmable current source 314.

Figure 4:
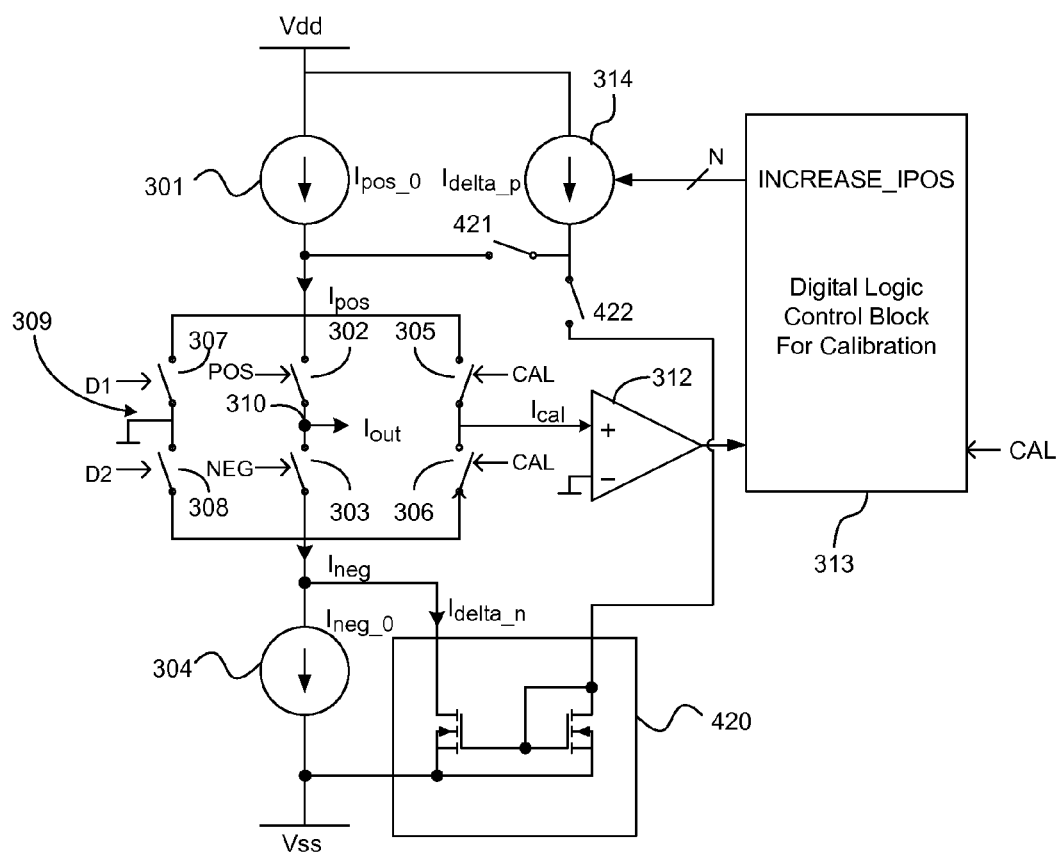
FIG. 4 illustrates another example switching current source with a single programmable current source and a current mirror.

FIG. 4 illustrates another example switching current source circuit 400 including a single programmable current source 314 and a current mirror 420. In this example, programmable current source 314 is selectively coupled to the output of current source 301 or to the output of current source 304 using switches 421 and 422. For example, if current Ipos is less than current Ineg, switch 421 is closed, and programmable current source 314 is adjusted so that the sum of Ipos_0 and Idelta_p is substantially equal to current Ineg. If current Ipos is greater than current Ineg, switch 422 is closed, and current Idelta_p from programmable current source 314 is coupled through current mirror 420 to the output of current source 304. In this configuration, programmable current source 314 and current source 304 are both sinking current, and programmable current source 314 is adjusted so that the sum of Ineg_0 and Idelta_p is substantially equal to current Ipos. Switches 421 and 422 may be controlled by a most significant bit (MSB) of a current mode digital-to-analog converter, for example. In another embodiment, programmable current source 314 may be coupled to the output of current source 304 and current mirror 420 may be coupled to the input of current source 301.

Figure 5:
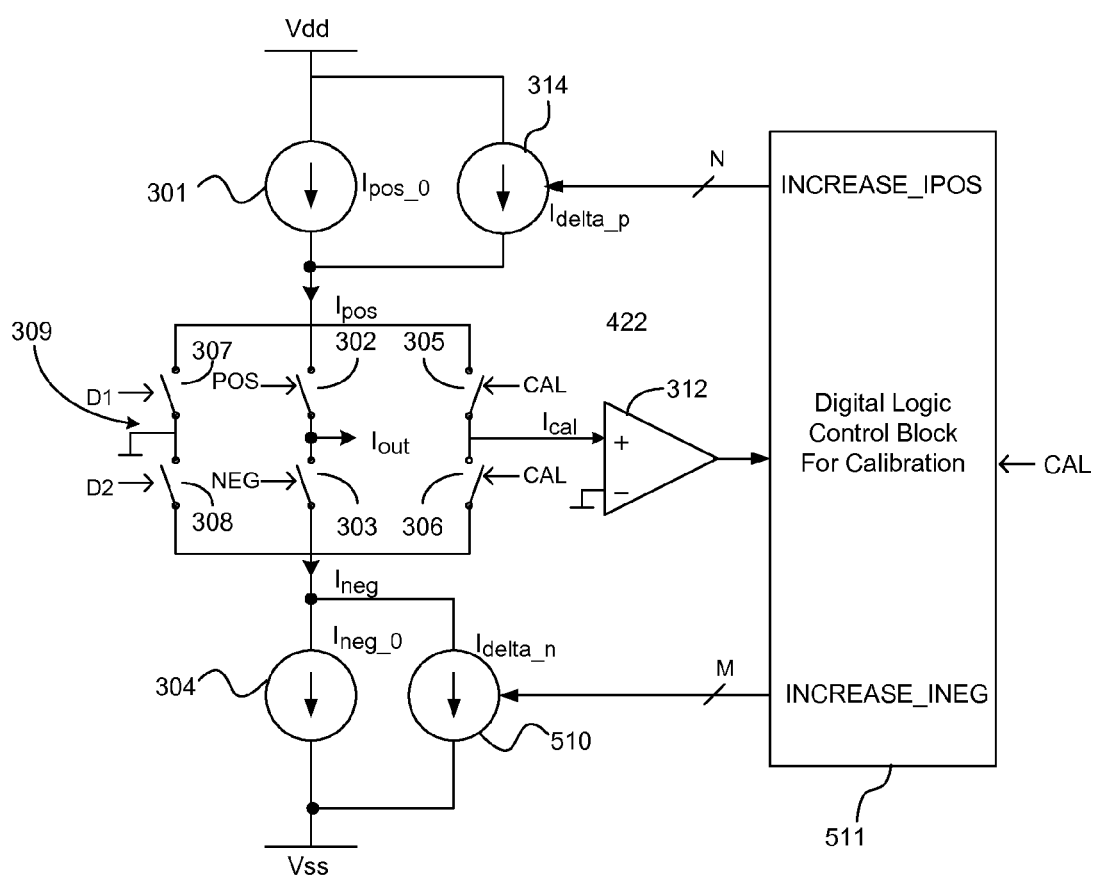
FIG. 5 illustrates an example switching current source with two programmable current sources.

FIG. 5 illustrates an example switching current source circuit 500 including two programmable current sources 314 and 510. In this example, current Ipos is adjusted using a first programmable current source 314, and current Ineg is adjusted using a second programmable current source 510. Here, the first programmable current source 314 is coupled in parallel with current source 301 to adjust current Ipos with a current Idelta_p, and the second programmable current source 510 is coupled in parallel with current source 304 to adjust current Ineg with a current Idelta_n. Digital logic control block 511 may generate a first N-bit digital signal to program current source 314 and a second M-bit digital signal to program current source 510 to reduce the difference between currents Ipos and Ineg. An example implementation may reduce the difference between currents Ipos and Ineg to the least significant bit ("LSB") of current mode DACs used in each programmable current source. For example, if Idelta_p(max)=0.004*Ipos_0 and Idelta_n(max)=0.004*Ineg_0, and M=N=12, then the final calibration error is $0.004/(2^{12}-1)$, which is less than 1 part per million (ppm) (e.g., assuming at least that the mismatch error is less than 0.004).

Figure 6A:
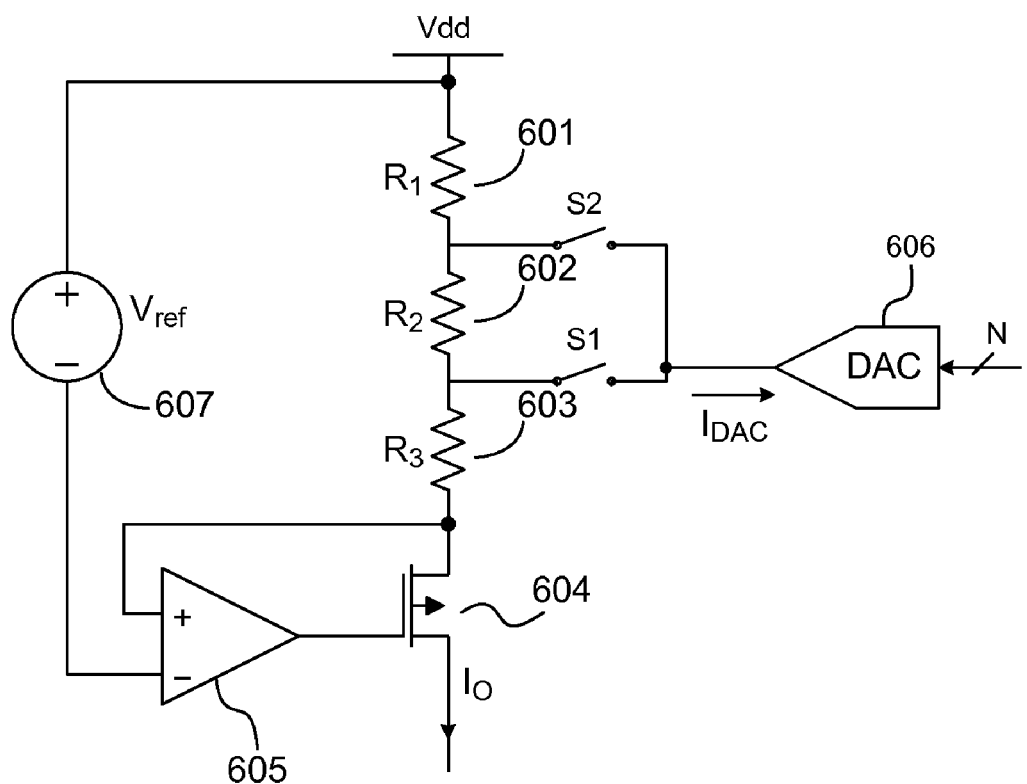
FIGS. 6A-B illustrate example programmable current sources.
Figure 6B:
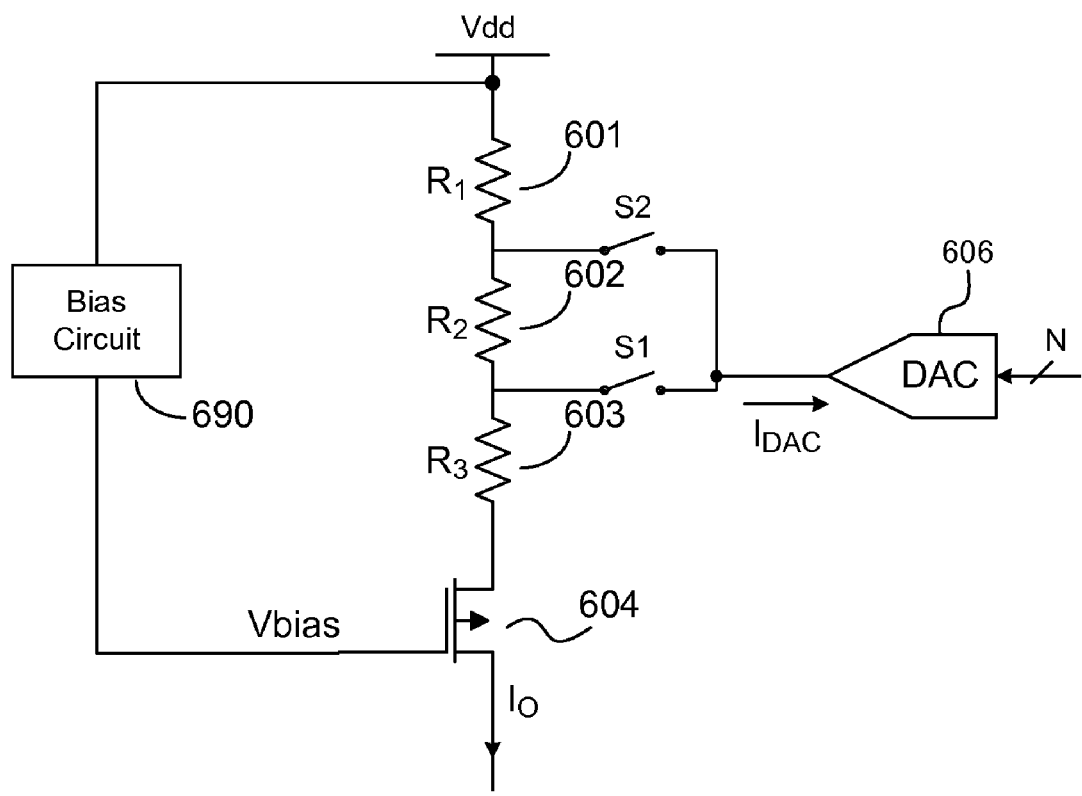

FIGS. 6A-B illustrate example programmable current source circuits 600A and 600B. In some applications requiring adjustment of very small currents, a programmable current source may include a current mode DAC and a current amplifier. For example, circuits 600A and 600B include a current mode DAC 606 that receives an N-bit digital signal and generates an output current $I_{DAC}$. In the example implementation shown in FIG. 6A, $I_{DAC}$ is directed into DAC 606 and is amplified by resistors 601-603, PMOS transistor 604, voltage reference 607, and amplifier 605. The example implementation shown in FIG. 6B omits amplifier 605 and uses a bias circuit 690 to generate a voltage Vbias to control PMOS transistor 604. Both of these examples includes two switches S1 and S2 for selecting the amplification of output current $I_{DAC}$. Assuming S1 is closed, output current $I_{DAC}$ is coupled to the node between resistor 602 and resistor 603, which is amplified by the resistors to cause a change in the voltage drop across resistor 602 and resistor 603. The change in voltage results in a change in output current. For example, if 100 uA is generated by DAC 606, then a 5 mV change is generated across the resistors if R1 and R2 are both 25 ohms (e.g., 100 uA*50 ohms=5 mV).

Figure 7:
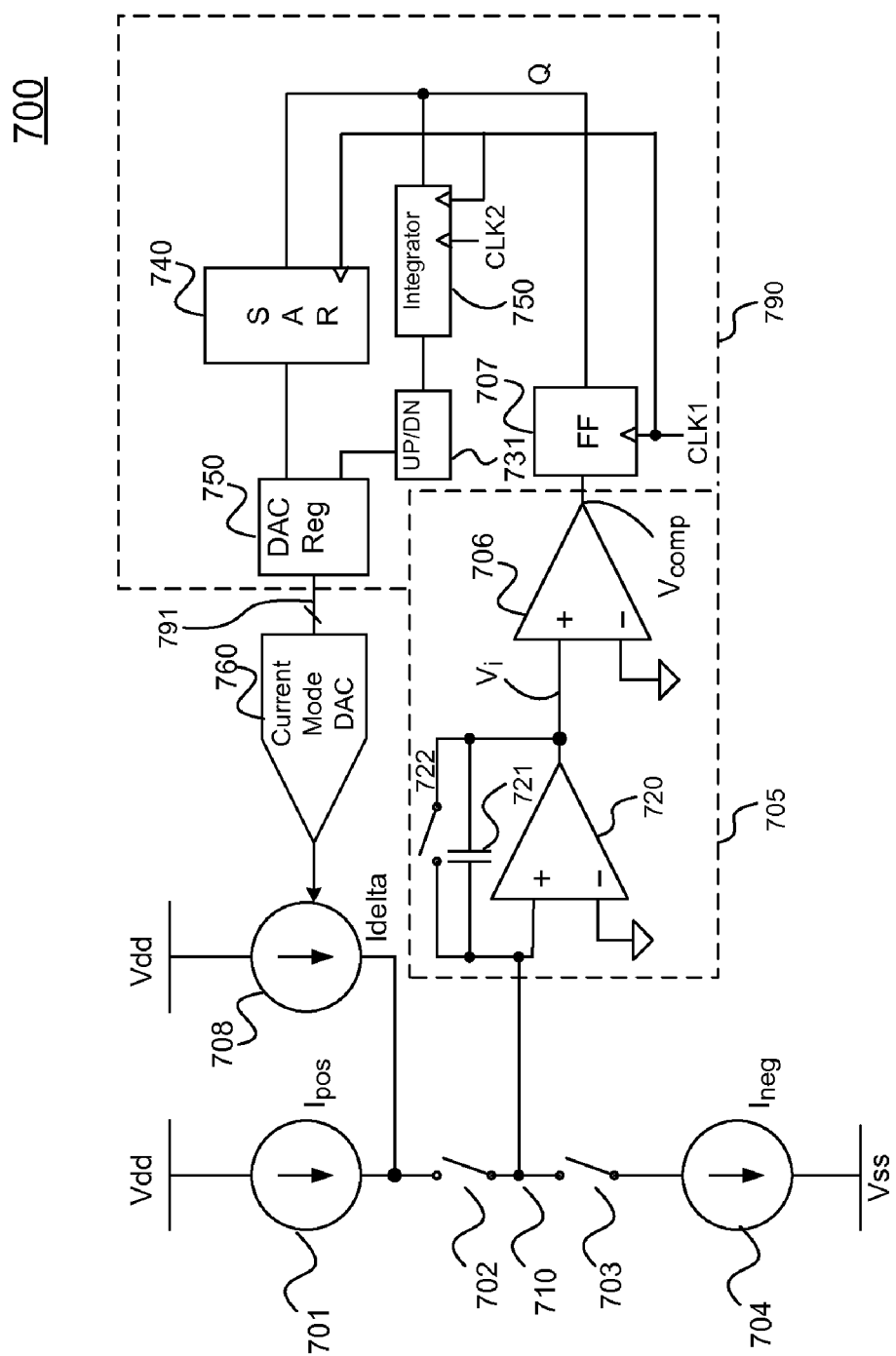
FIG. 7 illustrates an example digital logic control block for calibration.

FIG. 7 illustrates an example digital logic control block circuit 700 for calibration. This example illustrates a switching current source circuit 700 including a current source 701 coupled in parallel with a programmable current source 708. The outputs of current source 701 and programmable current source 708 are coupled through switch 702, node 710, and switch 703 to current source 704. In this example, programmable current source 708 includes a current mode DAC 760 that is adjusted based on the current difference at node 710. Specifically, node 710 is coupled through a comparison circuit 705 and digital logic 790 to produce a digital signal 791 to program a current mode DAC 760 to generate a programmable current Idelta. In this example, comparison circuit 705 includes a current integrator comprising an amplifier 720, capacitor 721, and a reset switch 722. The output of the current integrator is a voltage Vi, and the voltage Vi is coupled to a positive input of a comparator 706. The negative input of comparator 706 is coupled to ground. The output of comparator 706 is a digital signal Vcomp. In this example, digital signal Vcomp is coupled to an input of Flip Flop (FF) 707 to capture the value of digital signal Vcomp. FF 707 is clocked by CLK1. The output of FF 707 is a signal Q, which may be used to drive two different calibration circuits for implementing different calibration algorithms that may be used during different calibration phases. For example, during the initial calibration phase, a binary search algorithm may be used to perform the initial calibration. The binary search may be implemented using a successive approximation register (SAR) circuit 740. During the operational calibration phase, a linear approximation algorithm may be used to perform the calibration. The linear approximation may be implemented using a digital integrator circuit 730, for example. SAR circuit 740 and digital integrator circuit 730 are coupled to a DAC register 750 to store a digital signal value. The output of DAC register 750 produces a digital signal 791 used to program current mode DAC 760 and adjust current Idelta so that the sum of current Ipos and current Idelta is equal to current Ineg.

Figure 8:
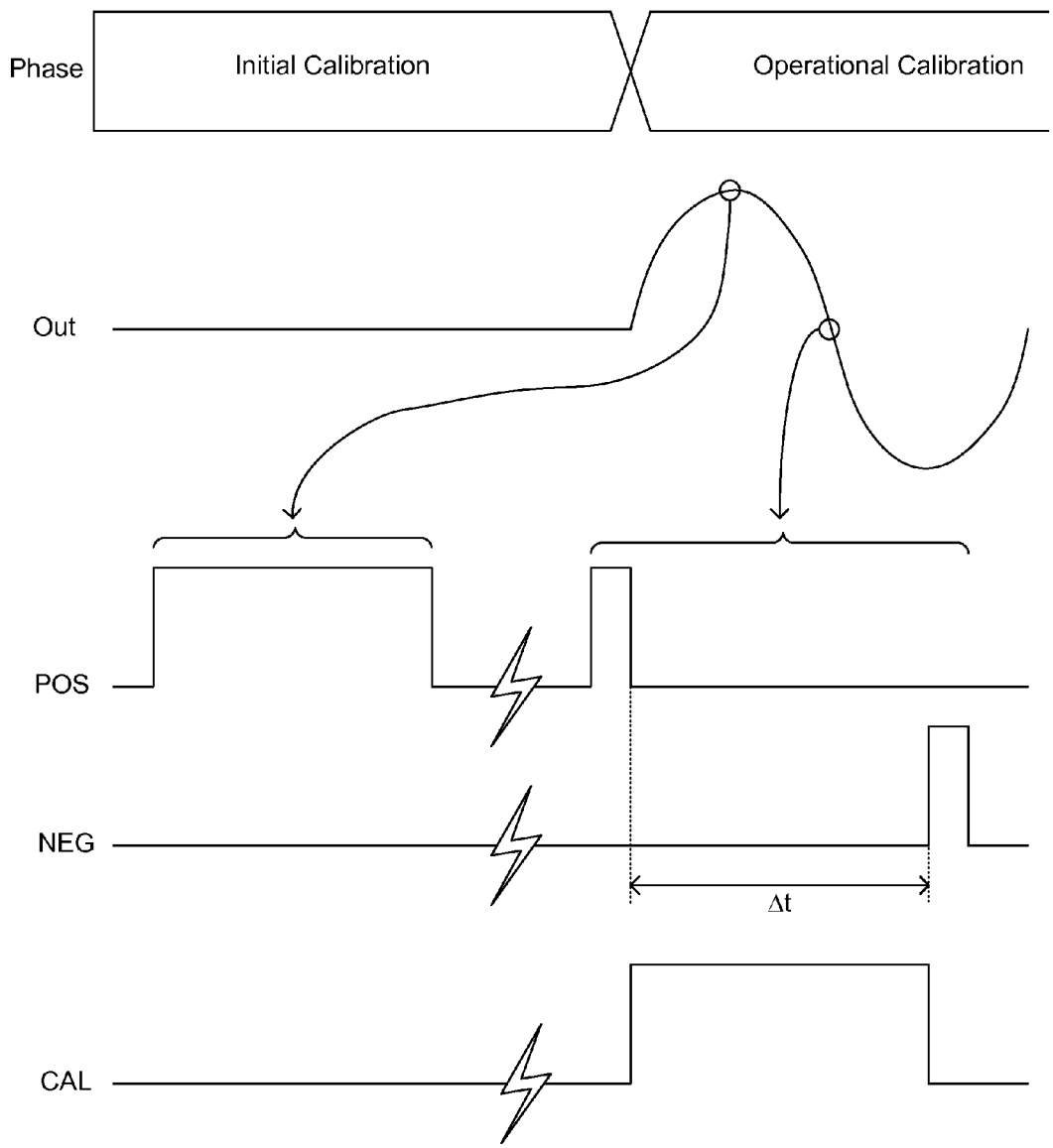
FIG. 8 illustrates a timing diagram for a switching current source calibration system.

FIG. 8 illustrates a timing diagram for a system including calibration circuits for a switching current source according to one embodiment of the present invention. An electronic system including a switching current source may include an initial calibration phase (e.g., during power up) and an operational calibration (e.g., during operation). The "Phase" waveform illustrates the initial calibration phase that occurs prior to an operational calibration phase. Calibration may be understood with reference to the example shown in FIG. 7. During the initial calibration phase, an electronic system including a switching current source may close switches 702 and 703 and perform a binary search using SAR circuit 740 to set a digital value in DAC register 750 corresponding to a value of current Idelta that minimizes the current mismatch error into node 710. During the initial calibration phase, an output ("Out") of the system (e.g., a switching audio amplifier output) using the switching current source may be zero. After initial calibration, the system may enter an operational phase. For example, a switching audio amplifier may generate a sinusoidal signal on the output. During operation, a switching current source in the system may accumulate errors due to changes in temperature, for example. In one embodiment, operational calibration may be performed based on the timing attributes of the POS and NEG signals mentioned above. For illustration, at a peak in a sinusoid, the POS signal may be high and the NEG signal may be low for a full switching cycle. However, when the sinusoid crosses zero, for example, the POS signal may be high for a short time at the beginning of a switching cycle and the NEG signal may be high for a short time at the end of the switching cycle. There is a time Δt when both POS and NEG are low and the switches connecting currents Ipos and Ineg to an output of the switching current source are open (e.g., switches 302 and 303 in FIG. 3). During such a time period, if the time period Δt between the deactivation of POS (e.g., opening switch 302 in FIG. 3) and activation of NEG (closing of switch 303 in FIG. 3) is greater than a threshold, for example, the calibration signal ("CAL") may be activated and an operational calibration may be performed. If the time period Δt, CAL may not be activated and operational calibration may not be performed, for example.

Figure 9:
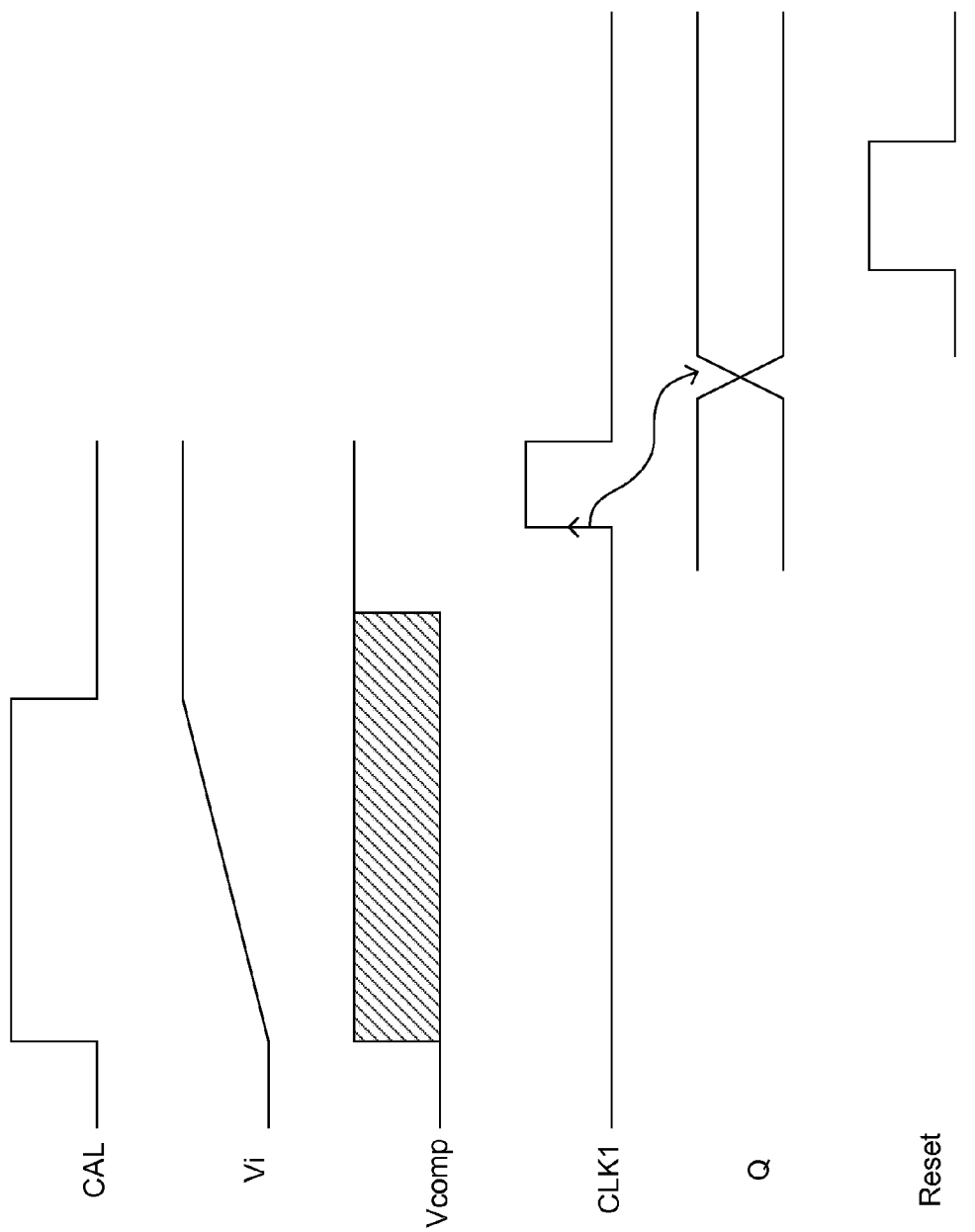
FIG. 9 illustrates example waveforms for the circuit of FIG. 7.

FIG. 9 illustrates waveforms for the circuit of FIG. 7. When CAL is activated (high), switches 702 and 703 are closed. Assuming current Ipos is greater than current Ineg for this example, the current difference between currents Ipos and Ineg will be injected into the input of amplifier 720 and integrated on capacitor 721 and the output voltage Vi will increase while CAL is high. During this time period the output of the comparator 706 may be resolving (e.g., during an output resolution time window shown in hashed lines in FIG. 9). After CAL goes low, switches 702 and 703 are opened, current integration stops, and the output of the comparator resolves (e.g., to a high digital output value). The digital output of comparator 706 is captured by FF 707 when CLK1 goes high. The output, Q, of FF 707 resolves a delay time after the rising edge of CLK1 is received, for example. A reset pulse may be generated a predetermined time period after CLK1 to close switch 722 across capacitor 721 to reset the integrator for the next measurement cycle. CLK1 may be offset from CAL by a predetermined time delay, for example. During initial calibration, CLK1 may be a 400 Khz clock, for example, and may also drives SAR circuit 740 to repeatedly measure the difference between currents Ipos and Ineg and adjust current Idelta. During operational calibration, Q may be received by digital integrator 730 (e.g., an up/down counter) to track changes in the current (in time) difference between currents Ipos and Ineg over time. For example, numerous operational calibrations may be performed over time and the result, Q, may be received by integrator 730. However, over time minor variations in temperature may cause the sum of current Ipos and current Idelta to be greater than current Ineg, while other minor variations in temperature may cause the sum of current Ipos and current Idelta to be less than current Ineg. Long term changes may be integrated and adjusted for using a second lower frequency clock CLK2. CLK2 may be 10 Hz, for example. Every cycle of CLK2, the result stored in integrator 730 is used to control UP/DOWN circuit 731 ("UP/DN"). UP/DOWN circuit 731 increases or decreases the digital value in DAC register 750, and the digital value is, in turn, used to adjust current mode DAC 760 to reduce the measured difference between currents Ipos and Ineg.

The above description illustrates various embodiments of the present invention along with examples of how aspects of the present invention may be implemented. The above examples and embodiments should not be deemed to be the only embodiments, and are presented to illustrate the flexibility and potential advantages of the present invention as defined by the following claims. For example, one or more steps of methods or processes discussed above may be performed in a different order (or concurrently) and still achieve desirable results. Based on the above disclosure and the following claims, other arrangements, embodiments, implementations and equivalents may be employed without departing from the scope of the invention as defined by the claims.

What is claimed is:

1. A circuit comprising:
   a first current source;
   a first switch having
      a first terminal coupled to an output of the first current source, and
      a second terminal coupled to an output node;
   a second current source;
   a second switch having
      a first terminal coupled to an output of the second current source, and
      a second terminal coupled to the output node;
   a third switch configured to open and close in response to a calibration signal, the third switch having
      a first terminal coupled to the output of the first current source, and
      a second terminal coupled to a first node;
   a fourth switch configured to open and close in response to the calibration signal, the fourth switch having
      a first terminal coupled to the output of the second current source, and
      a second terminal coupled to the first node; and
   a programmable current source having an output coupled to the first current source or the second current source,
   wherein the calibration signal closes the third switch and the fourth switch in response to both the first switch and the second switch being open, and
   wherein the programmable current source is adjusted using a digital signal to reduce a difference between a first current from the first current source into the first node and a second current into the second current source out of the first node, wherein the digital signal is generated using a digital algorithm based on said difference.

2. The circuit of claim 1, wherein the output of the programmable current source is coupled to the output of the first current source.

3. The circuit of claim 1, wherein the output of the programmable current source is coupled to the output of the second current source.

4. The circuit of claim 1, further comprising:
   a fifth switch having
      a first terminal coupled to the output of the programmable current source, and
      a second terminal coupled to the output of the first current source; and
   a sixth switch having
      a first terminal coupled to the output of the programmable current source, and
      a second terminal coupled to the output of the second current source.

5. The circuit of claim 4, further comprising a current mirror coupled between the second terminal of the sixth switch and the output of the second current source.

6. The circuit of claim 1, wherein the output of the programmable current source is coupled to the output of the first current source, the circuit further comprising a second programmable current source having an output coupled to the output of the second current source, wherein the second programmable current source is adjusted based on a difference between the first current from the first current source into the first node and the second current into the second current source out of the first node to reduce said difference.

7. The circuit of claim 1, wherein the programmable current source is digitally adjusted during an operational calibration phase if a time period between opening the first switch and closing the second switch is greater than a threshold.

8. The circuit of claim 1, wherein during an initial calibration phase, the programmable current source is adjusted using a first calibration circuit, and wherein during an operational calibration phase the programmable current source is adjusted using a second calibration circuit.

9. The circuit of claim 8, wherein the second calibration circuit operates at a lower frequency than the first calibration circuit.

10. The circuit of claim 1, wherein during an initial calibration phase, the programmable current source is adjusted using a binary search to reduce the difference, and wherein during an operational calibration phase the programmable current source is adjusted using a linear approximation to reduce the difference.

11. The circuit of claim 1, wherein the programmable current source comprises a current mode digital-to-analog converter.

12. The circuit of claim 11, wherein the programmable current source further comprises a current amplifier coupled to the output of the current mode digital-to-analog converter.

13. The circuit of claim 11, wherein the programmable current source further comprises:
 a transistor, the transistor having a gate, a source, and a drain;
 an amplifier having
  a first input coupled to the drain of the transistor,
  a second input coupled to a power supply terminal through a reference voltage, and
  an output coupled to the gate of the transistor; and
 a plurality of resistors coupled in series between the power supply terminal and the drain of the transistor,
 wherein an output of the current mode digital-to-analog converter is coupled to a second node between a first resistor and a second resistor of the plurality of resistors coupled in series, and
 wherein the source of the transistor is the output of the programmable current source.

14. The circuit of claim 11, wherein the programmable current source further comprises:
 a transistor, the transistor having a gate, a source, and a drain;
 a bias circuit coupled between the power supply terminal and the gate of the transistor;
 a plurality of resistors coupled in series between the power supply terminal and the drain of the transistor,
 wherein an output of the current mode digital-to-analog converter is coupled to a second node between a first resistor and a second resistor of the plurality of resistors coupled in series, and
 wherein the source of the transistor is the output of the programmable current source.

15. A switching audio amplifier comprising the circuit of claim 1.

16. A phase locked loop comprising the circuit of claim 1.

17. A method comprising:
 detecting a first signal, the first signal opening and closing a first switch, the first switch having a first terminal coupled to an output of a first current source and a second terminal coupled to an output node;
 detecting a second signal, the second signal opening and closing a second switch, second switch having a first terminal coupled to an output of a second current source and a second terminal coupled to the output node;
 closing a third switch and a fourth switch when both the first and second switches are open, the third switch having a first terminal coupled to the output of the first current source and a second terminal coupled to a first node and the fourth switch having a first terminal coupled to the output of the second current source and a second terminal coupled to the first node;
 detecting a difference between a first current from the first current source into the first node and a second current into the second current source out of the first node; and
 adjusting a programmable current source using a digital signal to reduce the difference, the programmable current source having an output coupled to the first current source or the second current source,
 wherein the digital signal is generated using a digital algorithm based on said difference.

18. The method of claim 17, wherein the programmable current source is digitally adjusted during an operational calibration phase if a time period between opening the first switch and closing the second switch is greater than a threshold.

19. The method of claim 17, wherein during an initial calibration phase, the programmable current source is adjusted using a first calibration circuit operating at a first frequency, and wherein during an operational calibration phase the programmable current source is adjusted using a second calibration circuit operating at a second frequency less than the first frequency.

20. The method of claim 17, wherein during an initial calibration phase, the programmable current source is adjusted using a binary search to reduce the difference, and wherein during an operational calibration phase the programmable current source is adjusted using a linear approximation to reduce the difference.

* * * * *